Figure 1:
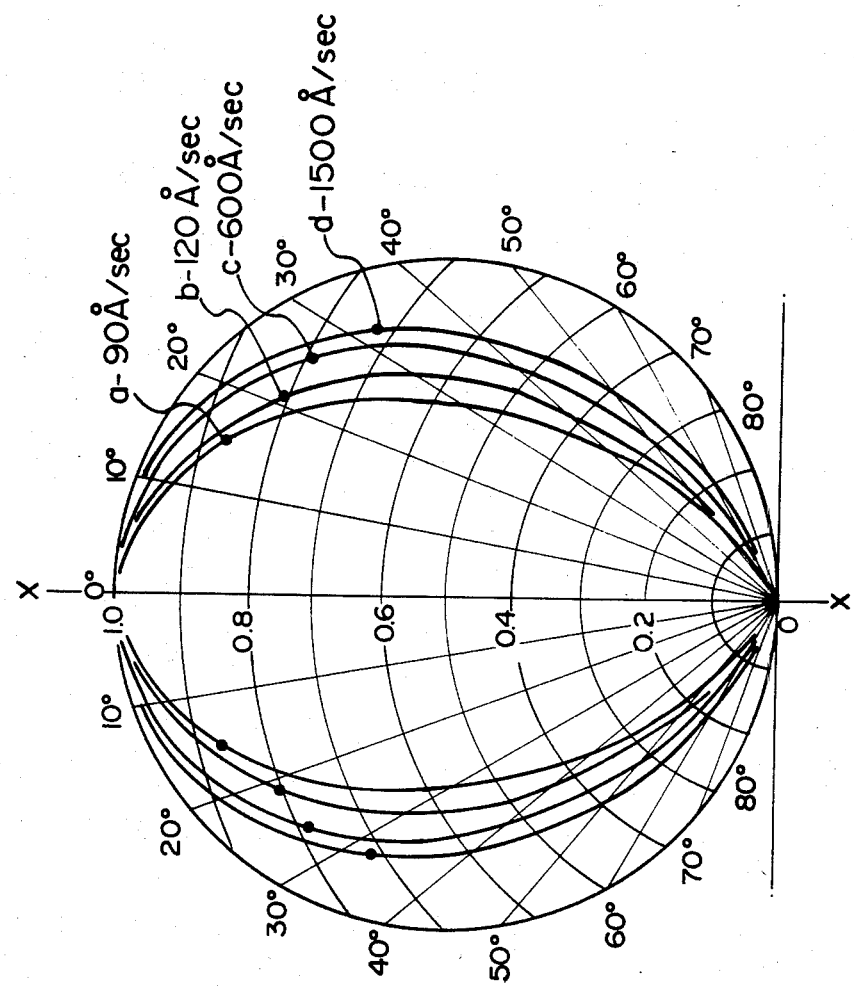

United States Patent [19]

Dobrowolski

[11] Patent Number: 4,543,910
[45] Date of Patent: Oct. 1, 1985

[54] VAPOR DEPOSITION REGULATING APPARATUS

[75] Inventor: Jerzy A. Dobrowolski, Ottawa, Canada

[73] Assignee: Canadian Patents and Development Limited, Ottawa, Canada

[21] Appl. No.: 660,969

[22] Filed: Oct. 15, 1984

[30] Foreign Application Priority Data

Oct. 17, 1983 [CA] Canada ................................. 439085

[51] Int. Cl.⁴ .............................................. C23C 13/08
[52] U.S. Cl. .................................... 118/665; 118/720; 118/504; 118/718; 427/10
[58] Field of Search ............... 118/665, 726, 720, 721, 118/718, 504; 427/9, 10, 255.5

[56] References Cited

U.S. PATENT DOCUMENTS

| | | | |
|---|---|---|---|
| 2,695,852 | 11/1954 | Sparks | 427/91 X |
| 3,333,982 | 8/1967 | Horn et al. | 118/726 X |
| 3,561,993 | 2/1971 | Geffcken | 118/504 X |
| 3,664,295 | 5/1972 | Ng et al. | 118/720 X |
| 3,799,800 | 3/1974 | Thelen et al. | 427/10 |
| 3,858,977 | 1/1975 | Baird et al. | 356/71 |
| 3,886,899 | 6/1975 | Johnson | 118/63 X |
| 4,140,078 | 2/1979 | Wilmanns | 118/665 |
| 4,222,345 | 9/1980 | Bergfelt | 118/720 |
| 4,380,212 | 4/1983 | Kraus | 118/720 |
| 4,449,478 | 5/1984 | Kraus | 118/720 |

OTHER PUBLICATIONS

Fowler et al., "Apparatus for Evaporating Thin Coatings with In Situ Control of Thickness", IBM Tech. Disclosure Bulletin, vol. 20, No. 7, Dec. 1977, pp. 2876-2877.

Primary Examiner—Norman Morgenstern
Assistant Examiner—Bernard F. Plantz
Attorney, Agent, or Firm—Francis W. Lemon

[57] ABSTRACT

A vapor deposition apparatus for continuously regulating the deposition thickness from vapor as it is being vacuum deposited across and progressively along one side of a substrate from one or more vapor sources spaced thereacross. The apparatus comprises a central shaft rotatably supporting hollow shafts in end-to-end relation, a series of profile discs on each of the hollow shafts and slidable radially thereon by a slot in each profile disc slidably locating on flats on the hollow shafts. The profile discs are placed between vapor sources, and the substrate moving through a vacuum coating chamber so that the profile discs form a mask controlling the vapor deposition across the substrate. The hollow shafts are coupled to electric motors which may rotate the hollow shafts in response to signals from deposition thickness sensing means.

4 Claims, 7 Drawing Figures

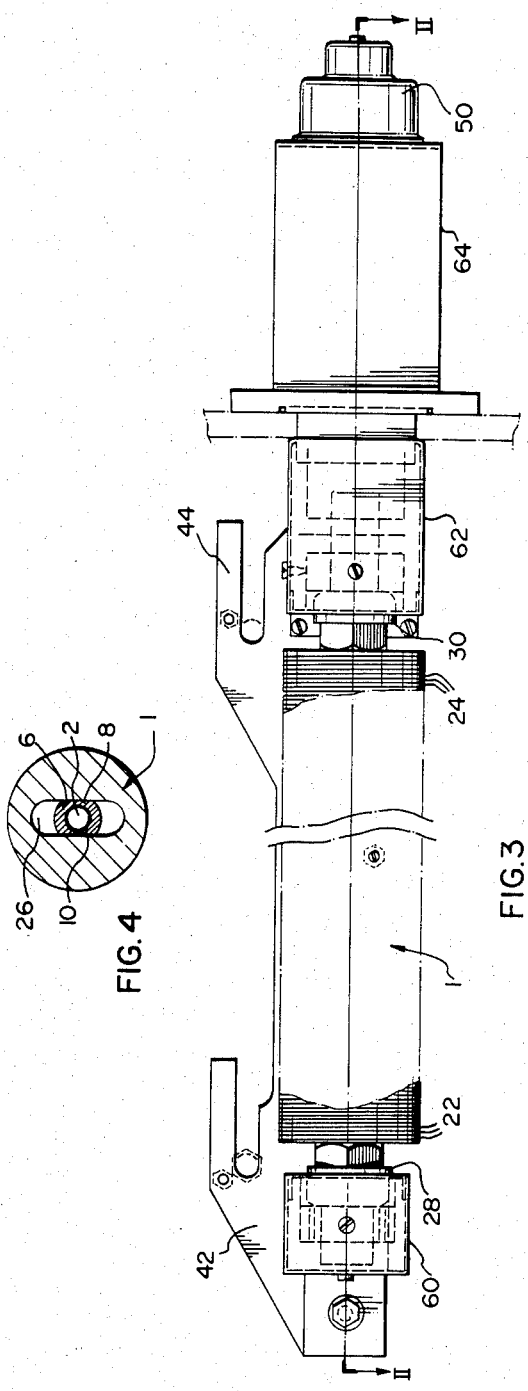

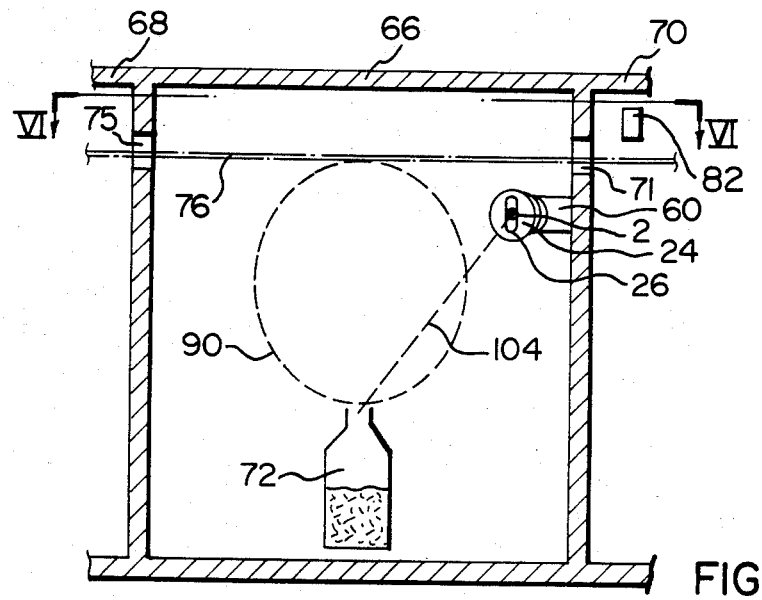
FIG.5
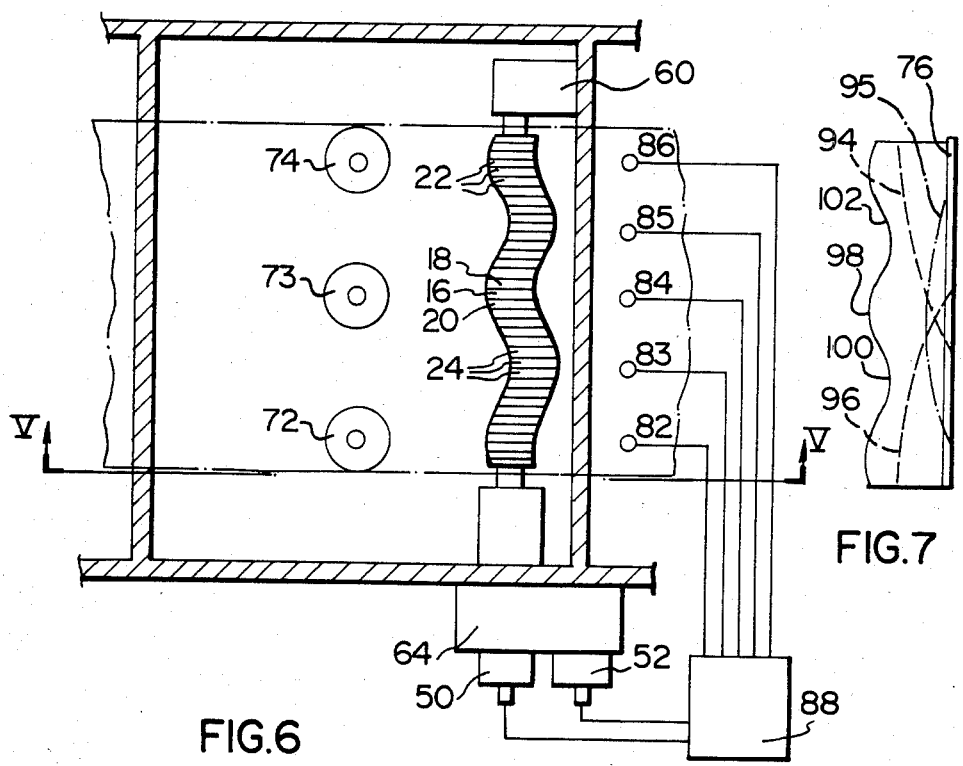
FIG.6
FIG.7

VAPOR DEPOSITION REGULATING APPARATUS

This invention relates to a vapour deposition regulating apparatus.

It has already been proposed in U.S. Pat. No. 2,695,852, dated Nov. 30, 1954, M. Sparks, to regulate the vacuum deposition of, for example, aluminum vapour on an N-type germanium body by depositing the vapour through the aperture or apertures in a mask. The area of deposition being determined by the configuration of the aperture or apertures. The mask is mounted by means of a longitudinally and rotatably adjustable support.

It has also been proposed in U.S. Pat. No. 3,799,800, dated Mar. 26, 1974, A. J. Thelen et al, to control the index of refraction of a layer on a substrate by depositing the layer on the substrate from two coating materials having different indices of refraction. The rate of evaporation is controlled by rotating first and second masks one of which is shaped as a half circle and the other as two, opposed segments of a circle, so that vapour is deposited gradually around the portion a substrate, such as a glass or quartz disc, that is not masked by the first and second masks. In a different embodiment the first rotatable mask has an arcuate slot which is partially closed by a single, segment of a cirle, rotatable second mask.

It has also been proposed in U.S. Pat. No. 3,886,899, dated June 3, 1975, J. R. Johnson, to feed glass containers sequentially between two straight, parallel portions of moving chains carrying co-operating mask halves which shield portions of the glass containers from treatment.

While the proposals of Sparks, Thelen et al and Johnson are useful for depositing films onto selected areas of the substrate, they cannot be used for continuously regulating the deposition thickness from vapour as it is being deposited across and along a substrate from sources whose evaporation characteristics change with time or rate of evaporation.

One optical interference authenticating means described in U.S. Pat. No. 3,858,977, dated Jan. 7, 1975, Baird et al, makes use of the fact that the reflected colour from a white light that one would actually perceive when a basically nonabsorbing optical multilayer coating is attached to an opaque substrate depends strongly on the angle of viewing and on the colour of the surface of the substrate. For example, a free standing nine layer coating composed of alternate optical interference layers of zinc sulphide and magnesium fluoride may have a high reflectance in the red part of the spectrum, and when viewed at increasing angles of incidence the wavelength of the main reflectance peak shifts from the red through the yellow and green towards the blue part of the spectrum. However, the colour that one would actually perceive when such a coating is attached to an opaque surface will depend strongly on the spectral absorption characteristics and thus colour of that surface. Since at normal incidence the multilayer will strongly reflect red light, light of shorter wavelengths will be transmitted by the coating and will fall on to the opaque surface. Some of the light falling onto that surface will be absorbed by it. The remainder is reflected back by this surface and transmitted out again by the filter.

If the surface specularly reflected substantially all of the light transmitted by the coating, as would, for example, a polished silver surface, then the reflected light from the surface will recombine with the reflected light from the coating to produce, what is observable by the eye as, white light once more. The intensity of the diffusely reflected light from a white paper surface will not be enough to form a true white colour with the specularly reflected light from the optical multilayer coating. However, the colour perceived will be very desaturated, and will be close to white. A maximum hue saturation is obtained when the surface of the substrate is coloured black.

Thus it is possible to obtain interesting colour effects by a suitable combination of optical interference coatings and patterns of surface colour on the substrate. For example, when a non-absorbing multilayer coating is bonded to a substrate bearing a black silhouette on a white background, only the silhouette will be revealed in the saturated hue reflected by the multilayer coating, which in itself is a function of the angle of viewing.

As this effect cannot be duplicated by any paint, pigment or colour copying procedure it enables the man in the street to distinguish at a glance an authentic valuable paper bearing such optical interference layers from even the best counterfeit lacking this authenticating device.

For this, and for many other applications large areas of single- and multilayer coatings of uniform thickness are required. A cost-effective way of producing such coatings is by condensing vapours of the materials of which the layers are to be composed onto a continuously moving web of the substrate material. Some of the processs that can be used to produce these vapours include evaporation in a vacuum from thermally or electron beam gun heated sources, sputtering, and chemical vapour deposition. The type and characteristics of the actual sources used will depend on the process used. As will be shown later, in several of these the angular vapour distribution from the sources will vary with time and with rate of deposition. It will depend also on the charge in the crucible and on a number of other parameters. Equivalent changes in angular vapour distribution can be observed in other deposition processes. If not allowed for, these variations will give rise to thickness non-uniformities across the width of the substrate. In the case of the optical interference authenticating means described above, these thickness variations may give rise to unacceptable variations in the hue of the reflected light across the width of the coated web. In coatings for other applications thickness variations will be equally undesirable.

From the above it is obvious that there is a need for an apparatus for continuously regulating the deposition thickness across the width of a substrate when, for example, the coated substrate is for use as an optical interference authenticating means of the type disclosed in the U.S. Pat. No. 3,858,977, dated Jan. 7, 1975, K. M. Baird et al. Such an apparatus would be useful for;

(i) compensating for changes in the angular vapour distribution as the volume of material from the vapour sources is gradually depleted, (ii) compensating for changes in angular vapour distribution with rate of evaporation, (iii) compensating for imbalances in the time of exposure of different portions of the substrate to the vapour sources, and (iv) obtaining different spectral reflectance characteristics across the substrate by varying the deposition thickness thereacross.

According to the present invention there is provided a vapour deposition regulating apparatus for continuously regulating the thickness of the film as it is being vacuum deposited across and progressively along one side of a substrate from vapour sources spaced thereacross, comprising:

(a) a central shaft,
(b) at least one two hollow shafts rotatably supported in end-to-end relation on an intermediate lengthwise portion of the central shaft, each hollow shaft having two substantially parallel flats on opposite sides thereof, and an externally screw threaded end portion adjacent one end of the central shaft.
(c) a disc bearing means on the central shaft and separating the adjacent ends of the hollow shafts,
(d) for each hollow shaft, a fixed, profile disc thereon, each fixed, profile disc being adjacent the disc bearing means and having substantially the same external dimensions as the disc bearing means,
(e) for each hollow shaft, a series of similarly shaped profile discs having substantially the same external dimensions as the disc bearing means and the fixed, profile discs and being disposed along that hollow shaft in side-by-side relationship to form a profile, each profile disc having a slot slidably locating that profile disc on the flats of the hollow shaft extending therethrough so that each profile disc is displaceable to form a desired mask profile,
(f) for each hollow shaft, a screw threaded sleeve having a bore portion located on the central shaft and a larger screw threaded portion bore portion screwed on to the threaded end portion of the associated hollow shaft to secure the profile discs thereon,
(g) driving means coupled to the screw threaded sleeves for rotating each hollow shaft independently, and
(h) mounting means for rotatably mounting the screw threaded sleeves in a vacuum deposition apparatus.

The apparatus may further comprise means securing one of screw threaded sleeves to the central shaft for rotation therewith, and coupling means coupling the driving means to the central shaft for rotating the central shaft on the screw threaded sleeve secured thereto.

The driving means may comprise electric motors each coupled to one of the screw threaded sleeves.

The apparatus may further comprise deposition thickness sensing means, for example, optical or quartz crystal type sensing means for sensing the thickness of vapour deposited on the substrate, and control means connected the sensing means and the electric motors for energizing the electric motors to cause the electric motors to rotate the profile discs in response to changes in the deposition thickness sensed by the sensing means.

The actual configuration of the deposition regulating apparatus will obviously depend on the number and type of sources used in the deposition equipment, and the modifications necessary to adapt the principle of the device to a different number of sources will be obvious to those skilled in the art. A device is described below that is suitable for the regulation of a deposition system based on thermal evaporation in a vacuum from three single, or three rows of resistance heated sources.

Figure 2:
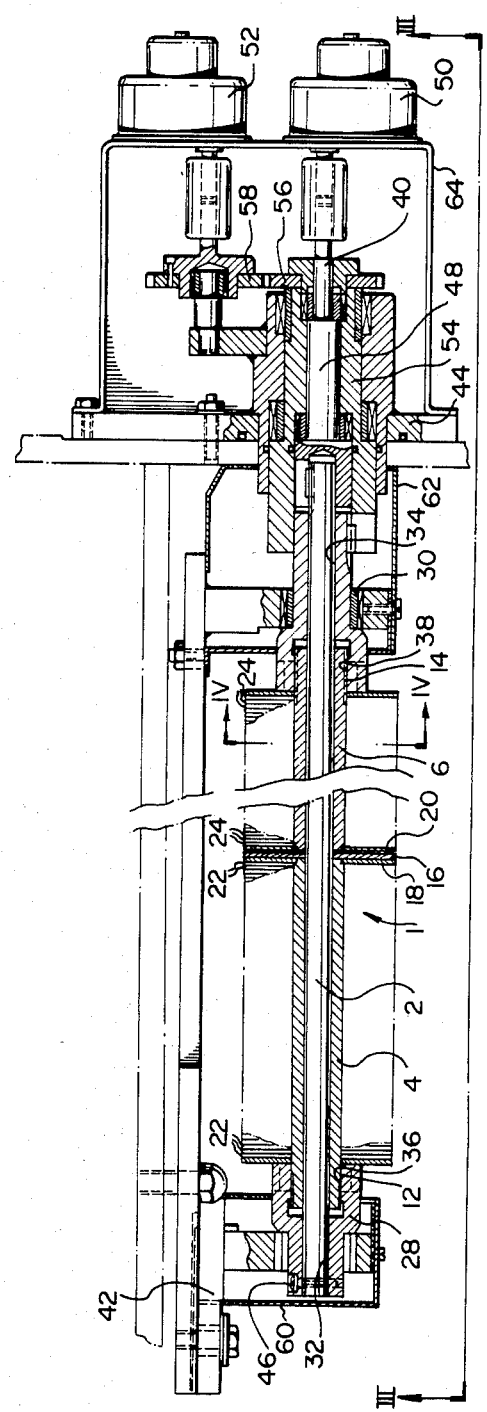

In the accompanying drawings which illustrate, by way of example, an embodiment of the present invention:

FIG. 1 is a polar diagram of the change in the angular vapour distribution with rate of evaporation in a vacuum coating process using resistance heated vapour sources, FIG. 2 is a partly sectional plan view along II—II, FIG. 3, of a vapour deposition regulating apparatus for continuously regulating the deposition thickness from vapour deposited across and progressively along one side of a substrate from three resistance heated vapour sources spaced thereacross, FIG. 3 is a side view along III—III, FIG. 2, FIG. 4 is a sectional end view along IV—IV, FIG. 2, showing a central shaft, a hollow shaft and a profile disc, FIG. 5 is a sectional side view along V—V, FIG. 6, of a portion of a vacuum deposition assembly containing a vacuum deposition regulating apparatus, of the type shown in FIGS. 2 to 4, at one end of the vacuum deposition chamber, and with portions of the vapour sources shown.

FIG. 6 is a sectional plan view along VI—VI, FIG. 5, and

FIG. 7 is a diagrammatic view of a typical deposition from the vapour sources, resulting from an angular vapour distribution of the type shown in FIG. 1, of the apparatus shown in FIGS. 5 and 6 without the regulating apparatus being used, and the profile that would be necessary for the regulating apparatus to partially mask the vapour being deposited in this manner to obtain a substantially uniform deposition thickness on the substrate.

In FIG. 1 there is shown in a polar diagram the change in the angular vapour distribution with rate of evaporation from an electrical resistance heated crucible containing the material to be deposited by the process of thermal evaporation in a vacuum. For any angle from the normal XX to the crucible vapour outlet, the vapour intensity is proportional to the distance along the radial vector from the point 0 to the appropriate curve a, b, c or d.

Referring now to FIGS. 2 to 4, there is shown a vapour deposition regulating apparatus, generally designated 1, for continuously regulating the deposition thickness from vapour (not shown) as it is being vacuum deposited across and progressively along one side of a substrate (not shown) from vapour sources (not shown) spaced thereacross, comprising:

(a) a central shaft 2 (FIGS. 2 and 4),
(b) two hollow shafts 4 and 6 rotatably supported in end-to-end relation on an intermediate lengthwise portion of the central shaft 2, each hollow shaft 4 and 6 having, as shown for hollow shaft 6 in FIG. 4, two substantialy parallel flats 8 and 10 on opposite sides thereof and an externally screw threaded end portion, 12 and 14 respectfully (FIG. 2), adjacent an end of the central shaft 2,
(c) a disc bearing 16 on the central shaft 2 and separating the adjacent ends of the hollow shafts,
(d) for each hollow shaft 4 and 6, a fixed, profile disc 18 or 20 thereon, each profile disc 18 and 20 being adjacent the disc bearing 16 and having substantially the same external dimensions as the disc bearing 16,
(e) for each hollow shaft 4 and 6, a series of profile discs 22 and 24 having substantially the same external dimensions as the disc bearing 16 and the fixed, profile discs 18 and 20 and being disposed along that hollow shaft 14 or 16 in side-by-side relationship to form a profile, each profile disc 22, 24 having a slot, such as slot 26 (FIG. 4), slidably locating that profile disc 22, 24 on the flats 8 and 10 of the hollow shaft 14 or 16 extending therethrough so that each profile disc 22, 24 is displaceable to form a desired mask profile, (f) for each hollow shaft 4 and 6, a screw threaded sleeve 28 and 30 respectively, each having a bore portion 32 or 34 located on the central shaft 2 and a larger screw threaded portion bore portion 36 or 38 screwed on to the threaded end portion 12 or 14 of the associated hollow shaft 4 or 6 to secure the profile discs 22 or 24 thereon, (g) driving means, generally designated 40, coupled to the screw threaded sleeves 28 and 30 for rotating each hollow shaft 4 and 6 independently, and (h) mounting means 42 and 44 for rotatably mounting the screw threaded sleeves 28 and 30 in a vacuum deposition apparatus.

In this embodiment means, in the form of a screw 46 (FIG. 2) is provided securing the screw threaded sleeves 28 to the central shaft 2 for rotation therewith, and coupling means in the form of a shaft 48 is provided coupling the driving means 40 to the central shaft 2 for rotating hollow shaft 4 through the central shaft 2 on the screw threaded sleeve 28 secured thereto.

The driving means 40 (FIG. 2) comprises two electric motors 50 and 52 each coupled to one of the screw threaded sleeves 28 and 30 respectively. The coupling 30 is connected to the electric motor 52 by means of a hollow shaft 54, rotatably mounted on the shaft 48, and meshing gears 56 and 58.

Casings 60, 62 and 64 are provided to isolate bearings and meshing gears from the vapour.

In FIGS. 5 and 6, similar parts to those shown in FIGS. 2 to 4 are designated by the same reference numerals and the previous description is relied upon to describe them.

FIGS. 5 and 6 show a vacuum deposition assembly, comprising a vacuum deposition chamber 66, a portion of a substrate supply chamber 68, a portion of a substrate receiving chamber 70, and three vapour supply crucibles 72 to 74.

The vacuum deposition chamber 66 has an inlet opening 75 for the substrate 76 (shown chain dotted) and an outlet opening 77 therefor.

A vapour deposition regulating device of the type shown in FIGS. 2 to 4 is mounted in the chamber 66 adjacent to the outlet opening 77.

Thickness sensing means in the form of monitors 82 to 86 (FIG. 6) are positioned in the receiving chamber 70, adjacent the outlet opening 77, and are connected to the control means 88 which, in turn, is connected to the electric motors 50 and 52 to rotate the profile discs 22 and 24 in response to changes in the deposition thickness sensed by the monitors 82 to 86.

In operation, the apparatus is arranged as shown in FIGS. 2 to 6 and the substrate 76 which may be a polyester film or any other suitable flexible foil, is fed into the chamber 66 through the opening 75 and exits therefrom through the outlet opening 77. A vacuum of about $10^{-4}$ to $10^{-6}$ Torr and a optically non-absorbing coating material such as, for example, cryolite, $MgF_2$, SiO, $SiO_2$, $ThF_4$, $TiO_2$, ZnS or $ZrO_2$ or an optically absorbing coating material of, for example, Ag, Al, Au, Cu, Cr, Ge, Ni, NiCr or Si is evaporated in the crucibles 72 to 74 to form vapour clouds 90 from each crucible.

Vapour from the vapour clouds 90 condenses sequentially along the substrate 76, to form coatings, as the substrate 76 passes over the crucibles 72 to 74.

As shown exaggerated in FIG. 7, without the use of the vapour deposition regulating device, the vapour from the crucibles 72 to 74 when each were fired separately, would result in coatings 94 to 96 on the substrate, respectively. The coatings 94 and 96 each increase in thickness towards the center of the substrate 76. During a production run all three crucibles are used simultaneously and the relative rates of the evaporation of the crucibles 72, 74 and of the centrally located crucible 73 are adjusted so that the thickness sensors 82, 84 and 86, which are in line with the crucibles 72, 74 and 73 respectively, register the same thickness. Nevertheless, the overall coating 98 resulting from the vapour of all three crucibles 72–74 will have an undulating surface containing hills or valleys 100 and 102 roughly in line with the thickness sensors 83 and 85. The depths of these valleys or heights of the hills will depend on the angular vapour distributions of the sources. To obtain a more uniform overall coating 98, the vapour deposition regulating device 1 has to be inserted into the vacuum deposition chamber 60, with the profile discs 22 and 24 suitably displaced on the hollow shafts 4 and 6, as shown in FIG. 6, and clamped in the displaced positions by means of the sleeves 28 and 30 (FIGS. 2 and 3).

In one useful arrangement the profile discs directly in line with the crucibles 72 to 74 are centered on the hollow shafts 4 and 6, and then gradually displaced from the symmetrical position so that, half way between the sources and in line with the thickness sensors 83 and 85 they reach their greatest displacement, as shown in FIG. 6. The actual shape that the displaced profile discs form depends on the angular vapour distribution of the sources. When the two hollow shafts 4 and 6 are oriented so that the flats 8 and 10 are parallel to the imaginary line 104 in FIG. 5 joining the mouth of the crucible 72 and the central shaft 2, the vapour deposition regulating device 2 will not affect the relative thickness variation of the coating 98 across the width of the web because the obstruction will be more or less uniform. On the contrary, when the hollow shafts 4 and 6 are rotated so that their flats 8 and 10 are at right angles to the imaginary line 104, the effect of the vapour deposition regulating device on the relative thickness of the coating 98 will be largest, because the change in exposure to the vapour across the width of the web will be greatest. At other orientations of the hollow shafts 4 and 6 is adjusted through the controller 88 so that the thickness sensors 83 and 85 indicate the same thicknesses as the sensors 82, 84 and 86. The vapour deposition regulating device 1 can therefore be used as a dynamic, variable mask to correct for changes in the angular evaporation characteristics with time or with rate.

In certain circumstances it may be advantageous to place a vapour deposition regulating device at each end of the vacuum deposition chamber 66.

The present invention is also useful for obtaining a coating which varies in thickness to provide particular variation of the characteristics of spectral reflectance and/or spectral transmittance, across the width of the web.

I claim:

1. A vapour deposition regulating apparatus for continuously regulating the deposition thickness from vapour as it is being vacuum deposited across and progressively along one side of a substrate, comprising:

(a) a central shaft, (b) at least two hollow shafts rotatably supported in end-to-end relation on an intermediate lengthwise portion of the central shaft, each hollow shaft having two substantially parallel flats on opposite sides thereof and an externally screw threaded end portion adjacent an end of the central shaft, (c) disc bearing means on the central shaft and separating the adjacent ends of the hollow shafts, (d) for each hollow shaft, a fixed, profile disc thereon, each fixed profile disc being adjacent the disc bearing means and having substantially the same external dimensions as the disc bearing means, (e) for each hollow shaft, a series of similarly shaped profile discs having substantially the same external dimensions as the disc bearing means and the fixed, profile discs and being disposed along that hollow shaft in side-by-side relationship to form a profile, each profile disc having a slot slidably locating that profile disc on the flats of the hollow shaft extending therethrough so that each profile disc is displaceable to form a desired masking profile, (f) for each hollow shaft, a screw threaded sleeve having a bore portion located on the central shaft and a larger screw threaded portion bore portion screwed on to the threaded end portion of the associated hollow shaft to secure the profile discs thereon, (g) driving means coupled to the screw threaded sleeves for rotating each hollow shaft independently, and (h) mounting means for rotatably mounting the screw threaded sleeves in a vacuum deposition apparatus.

2. An apparatus according to claim 1, further comprising means securing one of screw threaded sleeves to the central shaft for rotation therewith, and coupling means coupling the driving means to the central shaft for rotating the central shaft and the screw threaded sleeve secured thereto.

3. An apparatus according to claim 1, wherein the driving means comprises electric motors each coupled to one of the screw threaded sleeves.

4. An apparatus according to claim 3, further comprising deposition thickness sensing means for sensing the thickness of vapour deposited on the substrate, and control means connected the sensing means and the electric motors for energizing the electric motors to cause the electric motors to rotate the profile discs in response to changes in the deposition thickness sensed by the sensing means.

* * * * *